United States Patent [19]
Brown

[11] Patent Number: 5,146,165
[45] Date of Patent: Sep. 8, 1992

[54] PRESSURE MEASURING DEVICE RESPONSIBLE TO A MAGNETIC FLUX FIELD

[76] Inventor: Rork S. Brown, 1174 Carmona Ave., Los Angeles, Calif. 90019

[21] Appl. No.: 639,186

[22] Filed: Jan. 9, 1991

[51] Int. Cl.$^5$ .................. G01R 33/00; G01N 27/72
[52] U.S. Cl. .................. 324/260; 324/226
[58] Field of Search ........... 324/200, 226, 228, 205, 324/244, 260, 261, 262; 73/714, 728; 446/129, 130, 131, 132, 133; 434/301

[56] References Cited
FOREIGN PATENT DOCUMENTS
1048713  1/1959  Fed. Rep. of Germany ........ 73/728

*Primary Examiner*—Walter E. Snow
*Attorney, Agent, or Firm*—Roger A. Marrs

[57] ABSTRACT

A device is disclosed herein for measuring the pressure that a magnetic object exerts which includes a housing having a movable diaphragm held in a taut condition across an internal cavity. A central area of the diaphragm mounts a metallic or magnetic sensitive element operable in response to the presence of a magnetic field to move into and out of the internal cavity to create a detectable and readable pressure level. An analog or digital meter displays the pressure reading. The problem of determining the force exerted by a magnetic field is solved directly.

7 Claims, 1 Drawing Sheet

PRESSURE MEASURING DEVICE RESPONSIBLE TO A MAGNETIC FLUX FIELD

BACKGROUND OF THE INVENTION

1. Field of the Invention

The present invention relates to the field of pressure sensors and detectors, and more particularly to a novel pressure measuring device which measures ambient air pressure as a function of magnetic force in a magnetic field.

2. Brief Description of the Prior Art

In the past, it has been the conventional practice to use a variety of pressure sensitive devices for determining ambient air pressure. Such devices are wisely used in determining altitude by sensing barometric pressure. This is usually achieved through the employment of bellow devices, flexible bulbs or other means which are of long-standing design. Problems and difficulties have been encountered with such conventional pressure sensing devices which stem largely from the fact that these devices require substantial mechanical or electrical conversion so that pressure is not derived and by using converters or translating mechanisms, inaccuracies are oftentimes experienced and amplified.

Therefore, a long-standing need has existed to provide a novel means for determining ambient pressure whereby the force exerted by a magnetic field is solved directly by means of measuring the pressure that a magnetic object exerts in terms of attraction or repulsion.

SUMMARY OF THE INVENTION

Accordingly, the above problems and difficulties are obviated by the present invention which provides a novel pressure sensing device responsive to a magnetic field having a housing having a common bottom with a continuous sidewall about its peripheral edge terminating in a flexible diaphragm. The interior of the housing defined by the sidewalls, the bottom and the flexible diaphragm constitute an internal cavity occupied by a suitable gas such as air. The flexible diaphragm has a central area on which is mounted a magnetic sensitive element which moves into and out of the internal cavity via the flexible diaphragm in response to the strength of surrounding magnetic fields. A display device is coupled to the internal cavity of the housing via a check valve for directly indicating a pressure value. By employing the cross-sectional area of the housing and dividing the pressure reading by this number, the force that the magnetic field is producing at the point measured in space is then known directly.

Therefore, it is among the primary objects of the present invention to provide a novel means for determining the force exerted by magnetic field via pressure detection of the ambient atmosphere.

Another object of the present invention is to provide a novel measuring device adapted to measure the pressure that a magnetic object or element exerts in terms of attraction or repulsion.

Still a further object of the present invention is to provide a novel magnetic pressure measuring device employing the cross-sectional area of a housing having a movable diaphragm and by dividing the pressure reading displayed on a dial by the cross-sectional area number, the force that the magnetic field is producing at the point measured in space is determinable.

BRIEF DESCRIPTION OF THE DRAWINGS

The features of the present invention which are believed to be novel are set forth with particularity in the appended claims. The present invention, both as to its organization and manner of operation, together with further objects and advantages thereof, may best be understood with reference to the following description, taken in connection with the accompanying drawings in which:

DESCRIPTION OF THE PREFERRED EMBODIMENT

Figure 1:
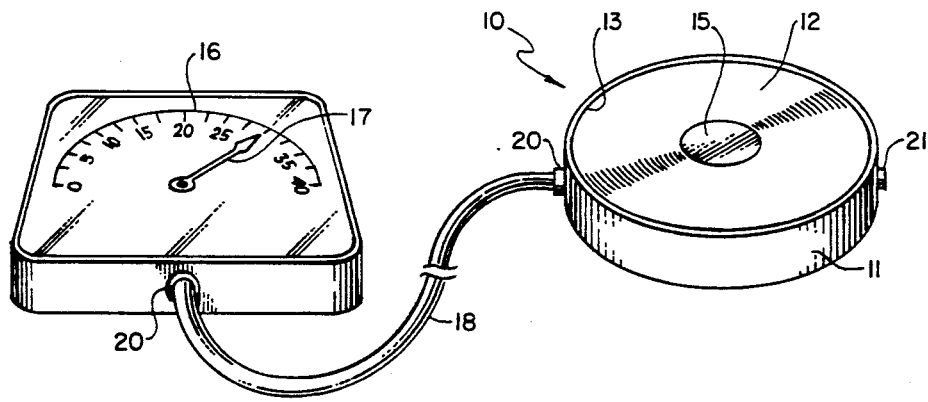
FIG. 1 is a perspective view showing the novel pressure measuring device of the present invention.

Referring to FIG. 1, the novel pressure measuring device of the present invention is illustrated in the general direction of arrow 10 which includes a detection device and a visual readout device operably connected thereto. In this connection, the sensing or detecting device includes a housing 11 having a pliable or deformable member 12 extending across the top thereof and held in position by any suitable sealing means, such as a seal 13. The pliable diaphragm 12 is carried on a continuous sidewall defining the housing 11 and further defining an interior cavity 14 as more clearly illustrated in FIG. 2. The diaphragm 12 has a central area which is occupied by a magnetic responsive element, such as a metal disc 15. The metal disc is composed of a ferrous material so that it is responsive to magnetic field forces. The internal cavity 14 is coupled to a visual display taking the form of a graduated scale 16 having a movable needle 17. The needle 17 is moved in response to the change of pressure within the internal cavity 14 as sensed via a hollow tube 18 in response to movement of the diaphragm into and out of the cavity. The visual readout is a pressure meter of either an analog or digital type and the needle is movable to indicate PSI.

The magnetic detector or magnetic responsive element may take the form of an impregnated metal, a permanent magnet, or an electro-magnet. Also, a rare earth element may be provided, and the concept of the present invention includes provision for incorporating a pair of diaphragms with magnetic flux or field sensing elements carried on the top and the bottom of the circular wall comprising the housing 11. In such an instance, the diaphragms will operate in unison or in a differential manner so as to cause a pressure within the internal cavity 14 that is sensed by the meter or gauge.

It is also to be understood that a one-way check valve 20 is employed between the internal cavity 14 and the hose 18 leading to the gauge. The check valve is preferably carried on the sidewall of the housing and permits the flow of gas or air pressure within the internal cavity to move in one direction. A second check valve is installed within an inlet port 21 so as to replenish pressure when the inner cavity is exhausted or requires additional gas. The check valve may be set to permit the increase of gas from ambient atmosphere or, if desired, the valve may be at any desired level, such as when replenishment is derived from a separate and independent pressurized source.

Figure 2:
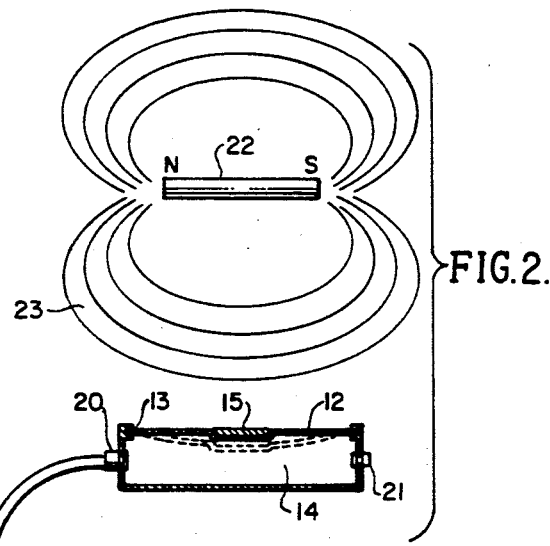
FIG. 2 is a transverse cross-sectional view of the measuring device shown in FIG. 1 and including a magnetic field sensed thereby.

Referring now in detail to FIG. 2, it can be seen that a magnet 22 generates a magnetic field force or flux identified by numeral 23, which is sensed by the magnetic element 15. When in repulsion, the magnetic element will cause the diaphragm 12 to depress into the inner cavity 14 as illustrated in broken lines. Such action reduces the volume of the cavity and causes a pressure to be exerted through the check valve 20 for a readout on the scale of the gauge. The indication is a reflection of air pressure in terms of PSI. Therefore, the pressure that a magnetic object, such as the permanent magnet bar 22 exerts in terms of attraction or repulsion, is indicated by the gauge of the present invention. By using the cross-sectional area of the housing which may take the form of a drum with a diaphragm movable into and out of the cavity or taking the form of a plastic bulb or the like, and then dividing the pressure reading by the cross-sectional area number, the force that the magnetic field 23 is producing at the point measured in space is then known directly. Thus, the problem of determining the force exerted by a magnetic field is solved directly. In mathematical terms, the formula is equal to $F = P/A$ where surface area equals II r of interior of container.

Figure 3:
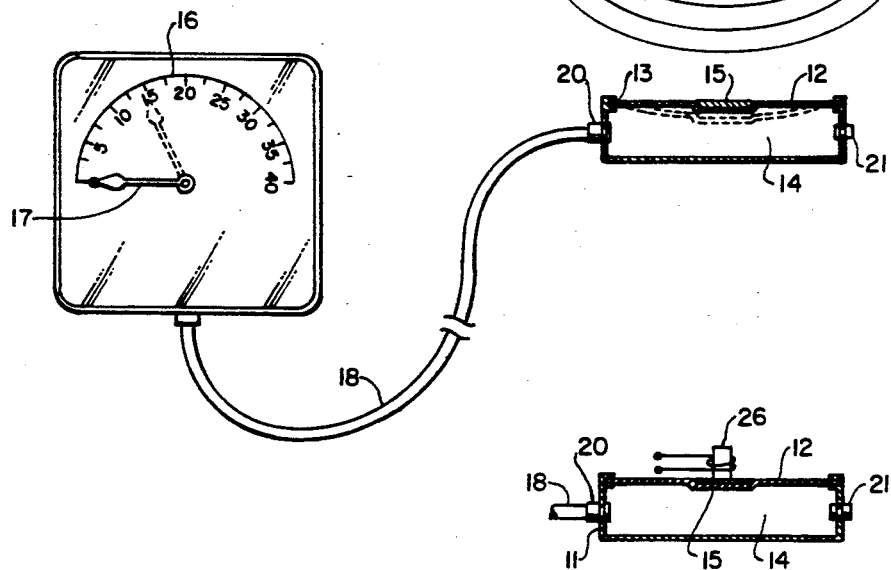
FIG. 3 is a view similar to the view of FIG. 2 illustrating another embodiment of the invention having a second magnetic sensor amplifying the detected pressure.

Referring now in detail to FIG. 3, another version is illustrated wherein the magnetic element 15 mounts an electro-magnet, indicated by numeral 26, which is energized in order to produce the magnetic flux field 23. The presence of the field will cause the diaphragm 12 to move as previously described, so as to set up a pressure differential in the internal cavity 14 and cause a readout on the visual gauge.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed is:

1. A pressure sensing device responsive to a magnetic flux field comprising:
   a housing having a continuous sidewall, a common bottom and a flexible diaphragm defining a common top;
   a single internal cavity defined between opposing surfaces of said diaphragm and said bottom occupied by air;
   an outlet carried on said housing having a check valve releasing said air exteriorly of said housing in response to movement of said diaphragm;
   said diaphragm having embedded magnetic device materials producing a centrally located magnetic flux to move said diaphragm; and
   a display device coupled to said internal cavity via check valve for directly indicating a pressure valve.

2. The invention as defined in claim 1 including:
   a magnetic device creating the magnetic flux in close proximity to said housing and magnetic element.

3. The invention as defined in claim 2 wherein:
   said magnetic device is an electro-magnet.

4. The invention as defined in claim 2 wherein:
   said magnetic device is a permanent magnet.

5. A pressure sensing device comprising:
   a housing having walls defining an internal cavity occupied by a gas:
   said housing walls including a diaphragm having a central area impregnated with a magnetic sensitive element;
   said diaphragm exposed on one side to said housing internal cavity and exposed to external atmosphere on its other side;
   a pressure gauge connected to said housing in communication with said internal cavity;
   said magnetic sensitive element being embedded in said diaphragm and responsive to the presence of a magnetic flux field to distort said diaphragm to change the volume of said internal cavity for supplying said gas to said gauge;
   a visual display having a graduated scale for displaying a direct reading of pressure.

6. The invention as defined in claim 5 including:
   a check valve carried on said housing coupling said gauge with said housing internal cavity.

7. The invention as defined in claim 6 wherein:
   said internal cavity has a predetermined cross-sectional area defined by said housing and said gauge including means for displaying a valve for said cross-sectional area and variations thereof in response to movement of said diaphragm.

* * * * *